United States Patent [19]
Kim

[11] Patent Number: 5,670,972
[45] Date of Patent: Sep. 23, 1997

[54] SELF-DIAGNOSIS ARRANGEMENT FOR A VIDEO DISPLAY AND METHOD OF IMPLEMENTING THE SAME

[75] Inventor: Young-Hee Kim, Suwon, Rep. of Korea

[73] Assignee: SamSung Electronics Co., Ltd., Suwon, Rep. of Korea

[21] Appl. No.: 546,865

[22] Filed: Oct. 23, 1995

[30] Foreign Application Priority Data

Oct. 22, 1994 [KR] Rep. of Korea ............... 27039 1994

[51] Int. Cl.$^6$ ..................................... G09G 1/08
[52] U.S. Cl. ..................................... 345/13; 345/12
[58] Field of Search ............... 345/112, 12, 13; 348/730, 177, 184, 189, 190, 521, 522, 4

[56] References Cited

U.S. PATENT DOCUMENTS 4,513,318  4/1985  Wilensky et al. ............... 358/139
5,504,521  4/1996  Webb et al. ..................... 348/189

Primary Examiner—Richard Hjerpe
Assistant Examiner—Vui T. Tran
Attorney, Agent, or Firm—Robert E. Bushnell, Esq.

[57] ABSTRACT

A self-diagnostic arrangement for a video display apparatus and method effectuating the same is disclosed. The apparatus according to the present invention includes a cable connector, amplifiers and a cathode ray tube and comprises a microprocessor storing information on a display status, for selectively switching signals to generate horizontal and vertical sync signals for displaying a variety of self-diagnostic displays, an on screen display IC for supplying a blanking signal and a video signal correspondingly responsive to information supplied from the microprocessor and a H/V deflection circuit for supplying on screen display video. signals to the CRT. There is also provided a method of self-diagnosis, which comprises the steps of generating internal horizontal and vertical sync.signals of predetermined frequency levels and displaying self-diagnostic screens representing video component colors and a display status.

8 Claims, 3 Drawing Sheets

SELF-DIAGNOSIS ARRANGEMENT FOR A VIDEO DISPLAY AND METHOD OF IMPLEMENTING THE SAME

CROSS REFERENCE TO RELATED APPLICATIONS

This application make reference to, incorporates the same herein, and claims all benefits accruing under 35 U.S.C §119 from an application entitled *A DISPLAY APPARATUS HAVING SELF-DIAGNOSTIC FUNCTION* earlier filed in the Korean Industrial Property Office on 22 Oct. 1994 and assigned Ser. No. 27039/1994.

BACKGROUND OF THE INVENTION

The present invention relates to an apparatus for a video display, and a more particularly, to a video display apparatus having a self-diagnostic circuit and method of implementing self-diagnosis by utilizing the same.

Conventionally, in a video display apparatus such as a monitor for a personal computer system, there is provided a raster arrangement for preventing a user from mistakenly believing a monitor is not operating properly when no raster pattern is displayed on the monitor's screen when no video signal is input during a power-on state. An exemplary apparatus including such arrangement is disclosed in Korean Utility Model Application No, 85-4679, wherein a vertical oscillation signal of sawtooth wave shape is automatically displayed on the screen of a monitor when an input signal supplied to the monitor is shut off.

In the arrangement of such a conventional type display apparatus however, a raster signal for displaying a raster pattern is limited to only utilizing either a flyback pulse or a RC oscillation circuit, for example, such as one of a bridge type or of a shifted-phase type, thereby displaying a single image pattern on a screen. A synchronizing signal employed in the apparatus for displaying an image signal on the screen causes a vibration phenomenon when displaying video text, thereby resulting in an incorrect frequency adjustment for the synchronizing signal, for example, an error of approximately 1 KHz for a horizontal synchronizing signal and of approximately more than 3 Hz for a vertical synchronizing signal.

In addition, by only displaying a vertical signal of sawtooth wave type as a self raster signal during a period of no signal input, the above described apparatus merely provides the displayed sawtooth wave as a warning sign indicative of no video input signal to an observer.

SUMMARY OF THE INVENTION

Accordingly, it is an object of the present invention to provide a video display apparatus capable of self-diagnosis and a method therefore.

It is another object of the present invention to provide a self-diagnostic arrangement for a video display and method of implementing the same wherein an input external video signal is automatically detected in order to display a pictorial image on a screen in either the state the input video signal has been disabled or the state where the video display has disconnected from an external computer system, such that a variety of images are provided and displayed in order for an observer to confirm whether the monitor is in proper working order.

It is still another object of the present invention to provide a self-diagnosis arrangement for a video display and method thereof wherein a pictorial image in more stabilized state is able to be displayed on a screen by use of an internally generated viable synchronizing signal when an external video signal input has been disabled.

It is yet another object of the present invention to provide a video display apparatus having a self-diagnostic function, which apparatus is capable of self-diagnosis, without using any external instruments for the diagnosis, during the process of production or when in use.

To achieve those and other objects, there is provided a video display apparatus including a cable connector which is connected to a signal cable extended from an external system, an amplifying portion for receiving and amplifying a video signal supplied from an external system via the cable connector, and a cathode ray tube for displaying a video signal input from the amplifying portion, which apparatus comprises a microprocessor for storing information on the details of the status of a display, for generating internal horizontal and vertical synchronizing signals, respectively of predetermined frequencies, by selectively switching between horizontal and vertical synchronizing signals supplied from either an internal generator or external system via the cable connector, a portion for supplying a blanking signal and an image data to the amplifying means for self-diagnosis correspondingly depending upon information provided from the microprocessor, and a horizontal/vertical deflection circuit for receiving the internal horizontal and vertical synchronizing signals from the microprocessor and for supplying horizontal and vertical synchronizing signals to the cathode ray tube.

The video display apparatus further incorporates an oscillator together with the microprocessor's horizontal and vertical synchronizing circuit for generating internal horizontal and vertical synchronizing signals, and a pair of switches for switching between horizontal and vertical synchronizing signals internally generated or externally supplied for output to deflection circuitry of a cathode ray tube.

There is also provided a video display apparatus incorporating a microprocessor, an on screen display portion and a cathode ray tube, which is characterized in that an external video image signal input is detected to generate variable horizontal/vertical deflection frequencies using an internal clock signal generator so that, in the absence of the external signal input, a sustained stabilized image is displayed.

There is yet provided a video display apparatus wherein a variety of information is stored in an on-screen display integrated circuit to be displayed in the form of characters and patterns, thereby providing a viewer with detailed optional information.

To achieve the above objects of the present invention, there is provided a method for self-diagnosis comprising the steps of determining whether a signal cable is connected to a cable connector, generating internal horizontal and vertical synchronizing signals when no connection between the signal cable and the cable connector is detected, displaying an initial self-diagnostic function menu table, demanding an input by a key stroke manipulation from an user, and displaying a detail of a self-diagnostic information display in dependence upon the key input.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
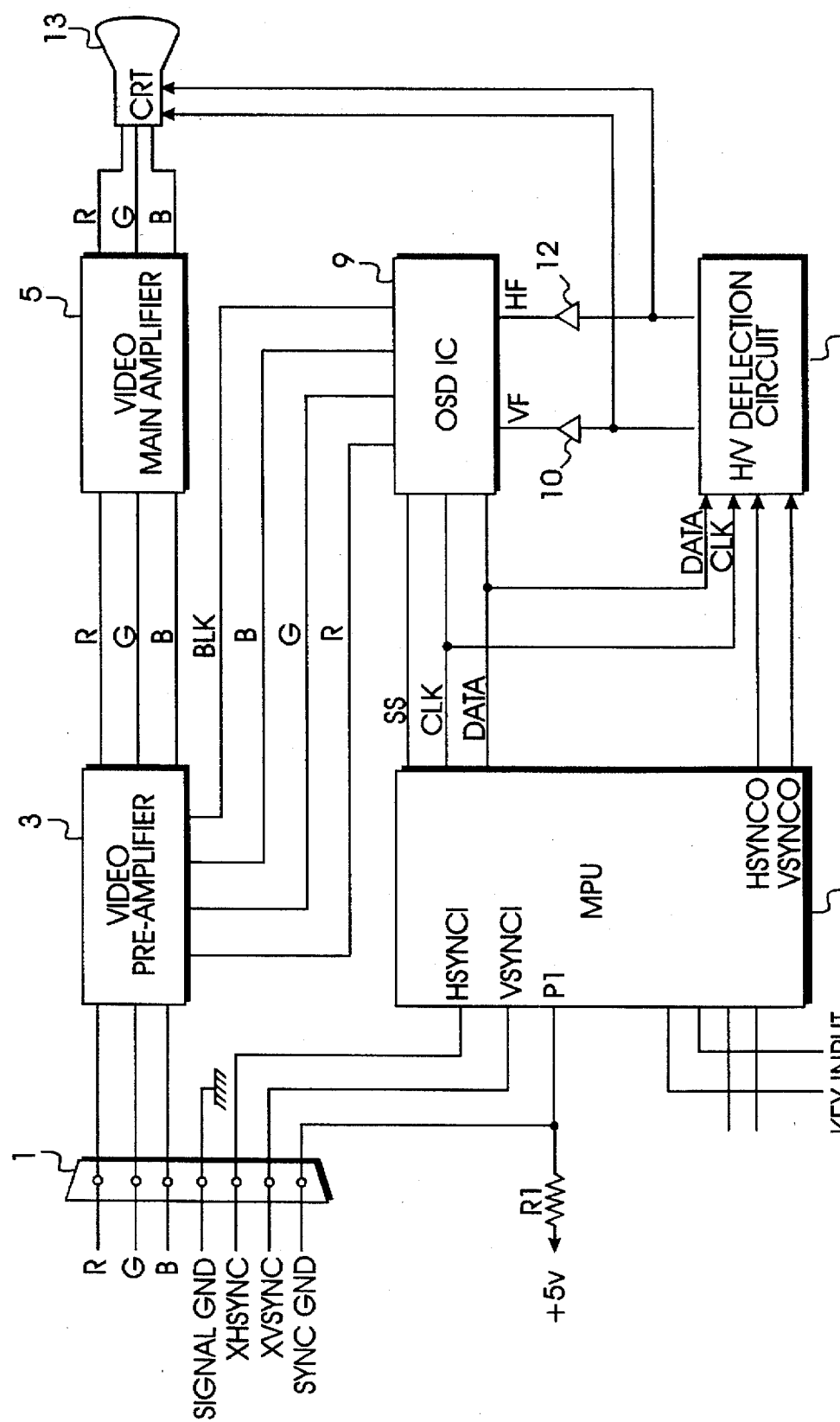
FIG. 1 is a block diagram constructed according to the principles of the present invention.

Turning now to the drawings and referring to FIG. 1, a schematic block diagram of a preferred embodiment of the present invention is shown. In a normal state of connection between cable connector 1, and an external system, video signals including video component signals R (red), G (green),and B (blue) (hereinafter, referred to as a "RGB video signal") and external horizontal and vertical synchronizing signals XHSYNC and XVSYNC (hereinafter, referred to as an "external H/V sync signal) are input through a cable into a video display via cable connector 1.

A video pre-amplifier 3, receives the RGB video signal from cable connector 1, amplifies the received RGB video signal and then mixes the amplified RGB video signal with a video signal supplied from an on-screen display integrated circuit (hereinafter, referred to as an "OSD video signal") for output to a video main amplifier 5. Video main amplifier 5 amplifies the magnitude of the mixed video signal output from video pre-amplifier 3, to the extent capable of driving a cathode ray tube (CRT) 13, and thus outputs an amplified mixed video signal to CRT 13.

A microprocessor 7 detects the frequency level of the external H/V sync signal XHSYNC and XVSYNC fed via cable connector 1, determines the type of video mode currently being supplied, then adjusts deflection parameters and controls horizontal and vertical deflection integrated circuit 11 so as to accurately display a determined current video mode.

Also, microprocessor 7 scans for a key input signal from a key pad (not shown) such that a video display is controlled according to a function corresponding to a key input signal.

In a self-raster display mode, particularly, the on-screen display pattern is arbitrarily interchangeable as a function of microprocessor 7, the construction of which will be described in detail with respect to FIG. 2.

On-screen display integrated circuit OSD IC 9 is adapted for displaying information using video signals SS stored in microprocessor 7, and for the sake of easy manipulation of a video display apparatus such as a monitor, receives as inputs a control clock signal CLK and data DATA pertaining to image control from microprocessor 7, and outputs, to video pre-amplifier 3, an on-screen blanking signal BLK and an OSD video signal including respective video components of red R, green G and blue B.

Here, on-screen display blanking signal BLK cause video pre-amplifier 3 to blank the RGB video signal such that an image displayed by OSD video signal is displayed clearly when the OSD video signal from OSD IC 9 and the RGB video signal from the external system are input to video preamplifier 3 simultaneously for display on a screen, The DATA for picture control output by microprocessor 7 includes information for controlling horizontal position, vertical position, pin-cushion, vertical size, V-linearity, trap geoid and pin balance. This DATA is fed to H/V deflection circuit 11 along with the control clock signal CLK and is accompanied by the horizontal and vertical synchronizing signals HSYNC, VSYNC supplied from microprocessor 7.

H/V deflection circuit 11 supplies horizontal and vertical deflection signals to cathode ray tube 13 in response to the DATA, the control clock signal CLK and the horizontal and vertical synchronizing signals HSYNC, VSYNC supplied from microprocessor 7. The vertical and horizontal deflections signals are also supplied to OSD IC 9 via flyback buffer amplifiers 10 and 12, respectively, as vertical and horizontal flyback signals.

Figure 2:
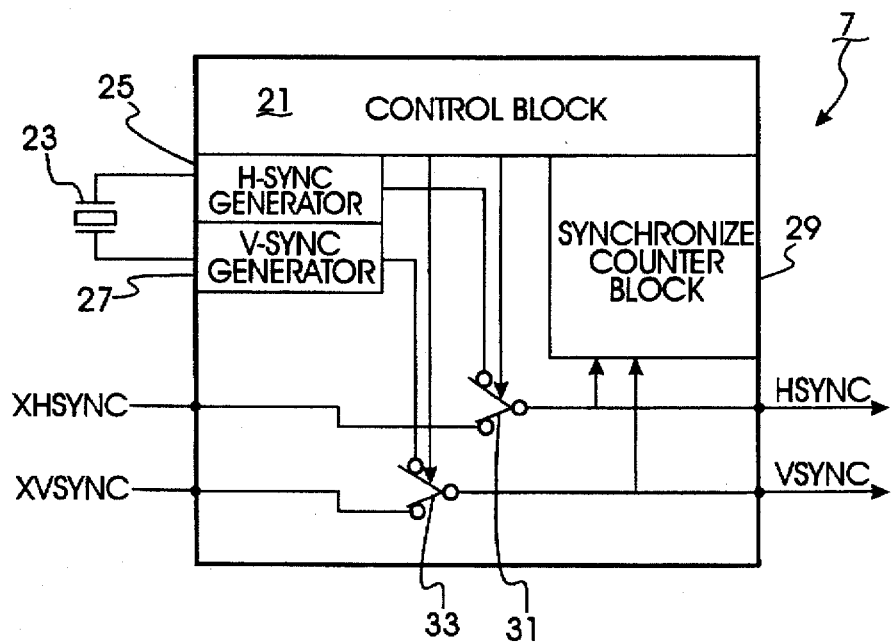
FIG. 2 is a schematic diagram illustrating an exemplar embodiment for generating a synchronizing signal in the microprocessor unit of FIG. 1, and constructed according to the principles to the present invention.

Referring now to FIG. 2, microprocessor 7 according to a preferred embodiment of the present invention, incorporates a pair of switches 31 and 33, responsive to a control signal from control block 21, for selectively switching between internal horizontal and vertical synchronizing signals IHSYNC, IVSYNC, generated by internal horizontal and vertical sync signal generating circuits 25 and 27 which are connected to an oscillation device 23, and external horizontal and vertical synchronizing signals input from cable connector 1, for output as horizontal and vertical synchronizing signals HSYNC, VSYNC. In the embodiment as illustrated in FIG. 2, control block 21 may be utilized as either one of software construction or hardware construction. The embodiment of control block 21 in microprocessor 7 of FIG. 2 is constructed by way of software arrangement as illustrated in the flow chart show in FIG. 4, however, it should be understood that the arrangement of control block 21 may easily be constructed by way of a hardware configuration.

As a result, in dependence upon the instant state, either internal horizontal synchronizing signal IHSYNC or external horizontal synchronizing signal XHSYNC is selected via switch 31 for output as horizontal synchronizing signal HSYNC for input to H/V deflection circuit 11, while either internal vertical synchronizing signal IVSYNC or external vertical synchronizing signal XVSYNC is selected for output via switch 33 as vertical synchronizing signal VSYNC for input to H/V deflection circuit 11.

Additionally, microprocessor 7 includes a synchronizing counter block 29. The horizontal and vertical synchronizing signals HSYNC and VSYNC, selected by way of switches 31 and 33 as described above, are also supplied for input to synchronizing counter block 29. Synchronizing counter block 29 provides count information in dependence upon the frequencies of the horizontal and vertical synchronizing signals HSYNC and VSYNC.

The internal horizontal and vertical synchronizing signals IHSYNC and IVSYNC, respectively generated by horizontal and vertical synchronizing circuits 25 and 27, are set at predetermined frequency levels by, in part. frequency dividing a crystal oscillation frequency generated in oscillation device 23.

Referring again to FIG. 1, when microprocessor 7 detects that the external horizontal and vertical synchronizing signals XHSYNC and XVSYNC are not input via cable connector 1 to ports HSYNCI and VSYNCI, microprocessor 7 controls switches 31 and 33 to output the internally generated horizontal and vertical synchronizing signals IHSYNC and IVSYNC as the horizontal and vertical synchronizing signals HSYNC and VSYNC.

A grounding terminal port SYNC GND of cable connector 1, which is connected to an input port P1 of microprocessor 7 in FIG. 1, is grounded to the grounded to the grounding chassis of a system when cable connector 1 is engagedly connected with a system cable, thereby causing input port P1 to shift in a "low" state. On the contrary however, a power supply of substantially +5 V voltage level is supplied via a pull-up resistor R1 to input port P1, maintaining in a "high" state when the system cable is not connected to cable connector 1. This enables microprocessor 7 to detect whether cable connector 1 is connected to an external system.

Alternatively, in determining above described state of connection, microprocessor 7 counts the frequency of external horizontal synchronizing signal XHSYNC. In this regard, a configuration of control block 21 in microprocessor 7 may well be constructed by way of a hardware configuration, especially by an application specific integrated circuit ASIC.

Figures 3A, 3B:
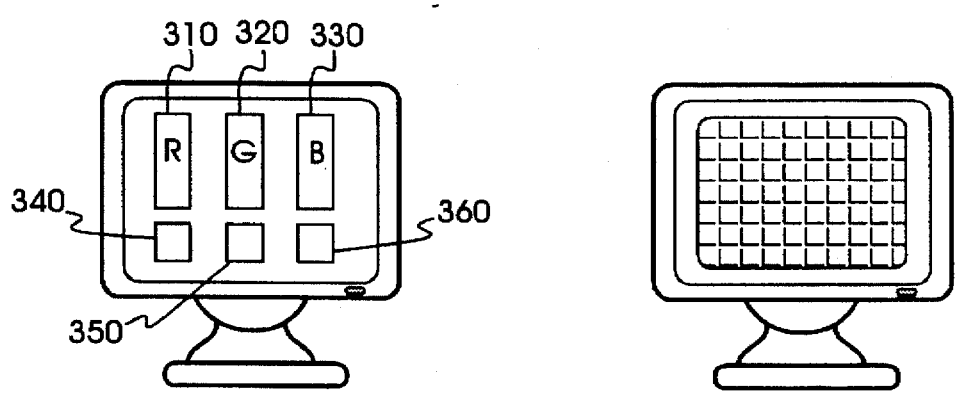
FIGS. 3A–3C are front views of a video display apparatus displaying various exemplar exhibits of self-diagnostic video text according to the principles of the present invention.
Figure 3C:
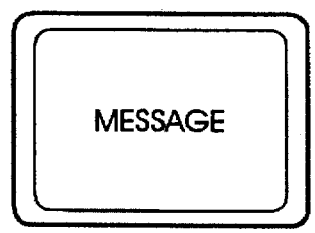

A variety of self-diagnosis display exhibits are shown displayed on the screens in FIG. 3A–3C. As Illustrated, a large detail of information indicative of various components of a video signal stored in microprocessor 7 and provided to OSD IC 9 can displayed according to a key input for selecting one of the functions of microprocessor 7, and various kinds of parameters for adjusting the components of the pictorial image displayed to the viewer can be input by the viewer using, for example, the keys of the keypad (not shown), whereas in a conventional diagnostic video display only a vertical waveform of sawtooth shape is displayed and adjustable.

In of FIG. 3A, color blocks including red block 310, green block 320, blue block 330 red-green block 340, green-blue block 350 and red-blue block 360 are displayed on a video display, so as to illustrate, collectively or separately, the chromaticity and entirety of each of the video component colors red R, green G and blue B.

Accordingly, the operational status of respective video component signals and circuits therefor as well as each the chromaticity thereof in a displayed screen including a state indicative of the integrity of a cathode ray tube, are provided as display information to a viewer.

In of FIG. 3B, a display of cross-hatch type designed for adjustment of a preset video mode is illustrated, by which such parameters as convergence or linearity characteristics of a CRT are provided, such that information about the CRT regarding this mode can be identified by the viewer.

In FIG. 3C, a plurality of messages required for an initial setting up of a video display screen are displayed in a sequential manner, wherein the frequency of an image currently being displayed or the counted value of a frequency counted by, for example, counter block 29, as shown in FIG. 2 and including such information as horizontal size and vertical size of the image and the admitted range of an input voltage level and an usage of the keys for key input manipulation are scrolled on the display screen for a viewer's utilization. A message representing no connection between cable connector and a cable of external system may also be displayed.

Figure 4:
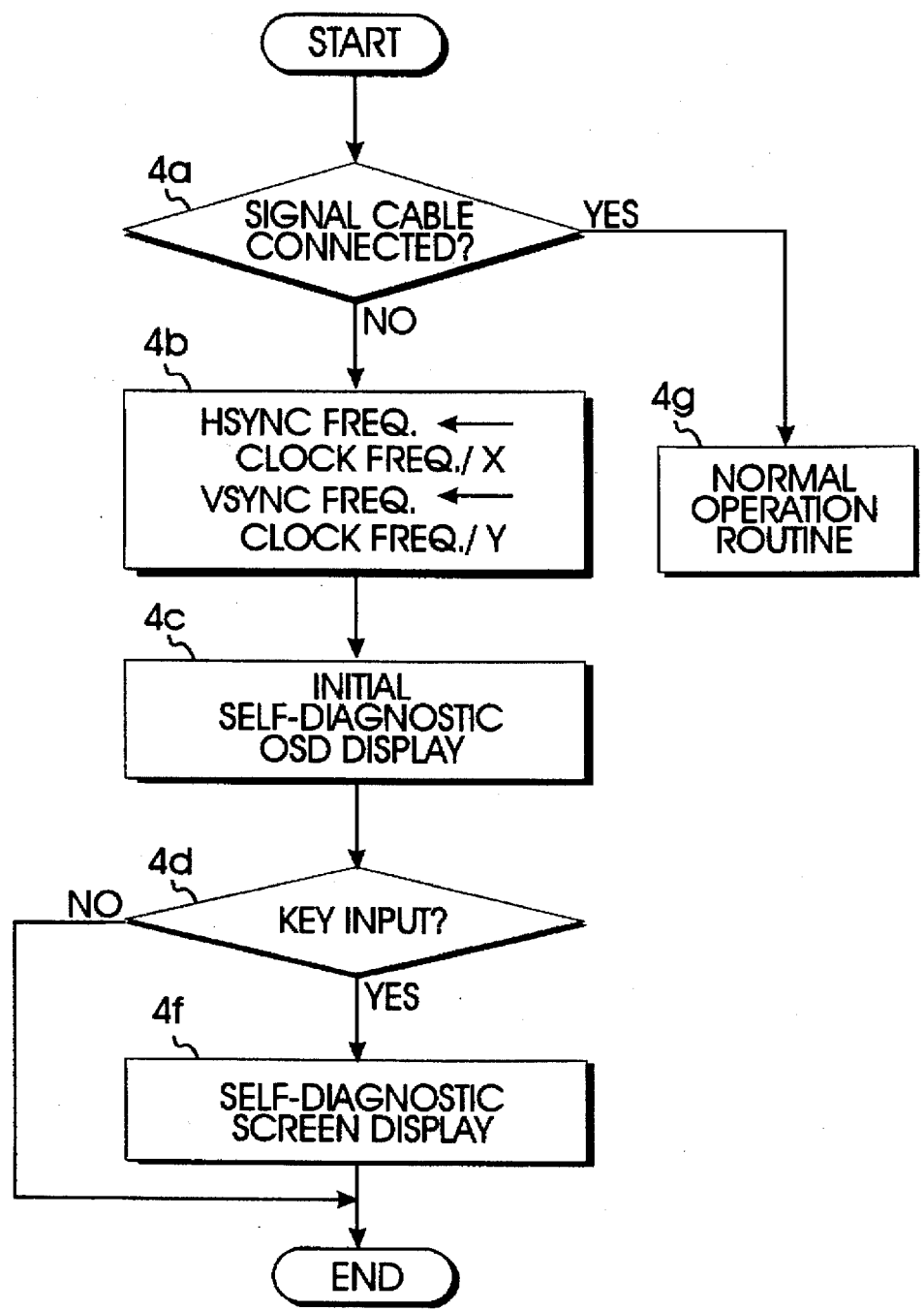
FIG. 4 is a flow chart illustrating the sequence of self-diagnosis according to the principles of the present invention.

A preset procedure for effectuating the above embodiment of the present invention is discussed with regard to FIG. 4. FIG. 4 is a flow chart showing a routine for self-diagnosis of a video display. In step 4a, microprocessor 7 determines whether cable connector 1 is connected to a signal cable of an external system. When it is determined that a signal cable is connected to cable connector I, a routine for normal operation of the CRT is carried out in step 4g. Accordingly, microprocessor 7 generates switching control signals for controlling switches 31 and 33 to select the external horizontal and vertical synchronizing signals XHSYNC and XVSYNC to be provided to output ports of microprocessor 7 as horizontal and vertical synchronizing output signals HSYNC and VSYNC.

Alternatively, when it is determined that the cable connector 1 is not connected to a cable of the external system, microprocessor 7 controls, in step 4b, the set up and generation of the internal horizontal and vertical synchronizing signals IHSYNC and IVSYNC by horizontal and vertical synchronizing circuits 25 and 27 as discussed with regard to FIG. 2, and generates switching control signals for controlling switches 31 and 33 to select the internally generated horizontal and vertical synchronizing signals IHSYNC and IVSYNC to be provided to output ports of microprocessor 7 as horizontal and vertical synchronizing output signals HSYNC and VSYNC. The respective frequencies of internal horizontal and vertical synchronizing signals IHSYNC and IVSYNC are obtained by the following equations.

$$IHSYNC = \frac{OSCILLATION\ CLOCK\ FREQUENCY}{X}$$

$$IVSYNC = \frac{OSCILLATION\ CLOCK\ FREQUENCY}{Y}$$

Where, the oscillation clock frequency is provided by the oscillation device 23 and each value of x and y is user adjustable according to, for example, a key input so that desired frequencies can be obtained.

Upon completion of setting up internal horizontal and vertical synchronizing signals, IHSYNC and IVSYNC to respective desired frequencies and selection thereof by switches 31 and 33, then in step 4c, stored data for an initial self-diagnosis display, such as the color bars for video components as shown FIG. 3A, the cross-hatches as shown in FIG. 3B or the messages as shown in FIG. 3C, is output from microprocessor 7 and displayed on a video screen of CRT 13 via OSD IC 9, pre-amplifier 3 and video amplifier 5.

Then, in step 4d, microprocessor 7 scans for a key input to detect a positive key input in order to display one of the self-diagnostic screen displays in FIGS. 3A, 3B or 3C whereas negative key input causes the self-diagnostic routine to end. For example, a message may be displayed inquiring of the viewer whether to continue the self-diagnostic routine, to which the viewer will respond by selection of a Y key for yes (positive) or an N key for no (negative).

Consequently, a viewer is able to obtain information regarding the connection status between a signal cable and cable connector 1, by referring to a message, as exemplified in FIG. 3C, and to get a variety of details regarding the status of either video components of an image or cathode ray tube by referring to a plurality of self-diagnostic displays.

As stated above, according to the self-diagnosis arrangement and method for a video display of the present invention, a viewer can easily check the status of a signal input to the display and self-diagnostic tests for video components, such as colors, as well as for the status of a display, such as a CRT, can be accomplished, without connecting cable connector to an external system, by displaying a variety of internally generated images.

In addition, according to the present invention an external device for synchronizing signal generation is not needed when setting up the video display during factory production due to the capability of self-generation or internal generation of horizontal and vertical synchronization signals. Further, a self-diagnosis test for the video display, such as a monitor, can be accomplished without connection to an external computer system due to the use of internally stored image information, thus effecting efficiency in use and in mass production.

While there have been illustrated and described what are considered to be embodiments of the present invention, it will be understood by those skilled in the art that various changes and modifications may be made, and equivalents may be substituted for elements thereof without departing from the true scope of the present invention. For example, the user could select a key input which causes the self-diagnostic routine to begin even when there is a connection between a cable and cable connector 1. Accordingly, the blanking signal BLK could enable the self-diagnostic display data, i.e., the OSD video signal, to be displayed on the entire screen or in a predetermined window portion as a picture-in-picture display. In addition, may modifications may be made to adapt a particular situation to the teaching of the present invention without departing from the central scope thereof. Therefore, it is intended that the present invention not be limited to the particular embodiments disclosed as the best mode contemplated for carrying out the present invention, but that the present invention includes all embodiments failing within the scope of the appended claims.

What is claimed is:

1. A video display apparatus including a microprocessor, on-screen display integrated circuit and a cathode ray tube, characterized in that:

the microprocessor receives horizontal and vertical synchronization frequencies, generates internal horizontal and vertical synchronization frequencies and determines a state of connection between said apparatus and an external system; and the cathode ray tube is fed with either one of said horizontal and vertical synchronization frequencies or said internal horizontal and vertical synchronization frequencies determined by said microprocessor in response to the state of connection.

2. A method for self-diagnosis testing of a video display apparatus including a cable connector, a microprocessor, on-screen display means and a cathode ray tube, said method comprising the steps of:

checking said cable connector to determine connection to an external system;

generating horizontal and vertical synchronizing frequencies in said microprocessor in case of no connection between said cable connector and external system; and outputting a self-diagnosis display signal to said cathode ray tube from said on-screen display means responsive to an input signal supplied from said microprocessor.

3. The method of claim 2, further comprising the steps of:

detecting an input signal from a key pad; and displaying a pre-stored self-diagnostic display on a screen of said cathode ray tube in response to said input signal from said key pad.

4. A method for self-diagnosis testing of a video display apparatus including a cable connector to which a signal cable of an external system is engagedly connected, amplifier means for amplifying a video signal input via said cable connector and a cathode ray tube for displaying said amplified video signal input from said amplifier means, said method comprising the steps of:

a first process for generating internally generated horizontal and vertical synchronizing signals of predetermined frequencies, respectively, on an occasion of no connection between said signal cable and cable connector; and a second process for generating signals for at least two self-diagnostic display screens representing a detail of video component colors and display status from predetermined data stored in said apparatus.

5. A video display apparatus including a cable connector to which a signal cable of an external system is engagedly connected, an amplifier for receiving a first video signal supplied via said cable connector and a cathode ray tube for displaying said signal input from said amplifier, said apparatus comprising:

a microprocessor storing information for an image status being displayed, for selectively switching between internal horizontal and vertical synchronizing signals from an internal generator and external horizontal and vertical synchronizing signals from said external system to provide output horizontal and vertical synchronizing signals having predetermined frequency levels based on a connection status between said signal cable and said cable connector;

means for supplying a plurality of second video signals corresponding to said stored information provided by said microprocessor to said amplifier; and horizontal and vertical deflection circuits, responsive to said output horizontal and vertical synchronizing signals input from said microprocessor, for supplying horizontal and vertical deflection signals to said cathode ray tube.

6. The video display apparatus of claim 5, wherein said microprocessor further comprises:

oscillator means for generating an oscillation clock frequency;

horizontal and vertical synchronizing circuits as said internal generator for generating said internal horizontal and vertical synchronizing signals using said oscillation clock frequency; and a pair of switches for selectively switching between said internal horizontal and vertical synchronizing signals and said external horizontal and vertical synchronizing signals.

7. The video display apparatus of claim 5, wherein said predetermined frequency levels are adjustable.

8. The video display apparatus of claim 6,wherein said predetermined frequency levels are adjustable.

* * * * *